United States Patent
Contet et al.

(10) Patent No.: US 10,746,786 B2
(45) Date of Patent: Aug. 18, 2020

(54) METHOD FOR PRODUCING AT LEAST ONE ELECTRONIC MODULE ON A METAL RETAINER PLATE, INCLUDING AT LEAST ONE ELECTRICAL TEST

(71) Applicants: Continental Automotive France, Toulouse (FR); Continental Automotive GmbH, Hannover (DE)

(72) Inventors: Hervé Contet, Lamasquere (FR); Martin Throm, Toulouse (FR); Dietmar Huber, Rödermark (DE)

(73) Assignees: Continental Automotive France (FR); Continental Automotive GmbH (DE)

( * ) Notice: Subject to any disclaimer, the term of this patent is extended or adjusted under 35 U.S.C. 154(b) by 0 days.

(21) Appl. No.: 16/323,859

(22) PCT Filed: Sep. 7, 2017

(86) PCT No.: PCT/FR2017/052379
§ 371 (c)(1),
(2) Date: Feb. 7, 2019

(87) PCT Pub. No.: WO2018/046858
PCT Pub. Date: Mar. 15, 2018

(65) Prior Publication Data
US 2019/0212385 A1 Jul. 11, 2019

(30) Foreign Application Priority Data
Sep. 8, 2016 (FR) ...................................... 16 58329

(51) Int. Cl.
*G01R 31/28* (2006.01)
*H01L 23/31* (2006.01)
(Continued)

(52) U.S. Cl.
CPC ....... *G01R 31/2851* (2013.01); *G01D 11/245* (2013.01); *G01P 1/026* (2013.01); *H01L 23/3107* (2013.01); *H01L 23/3135* (2013.01)

(58) Field of Classification Search
CPC ............ G01R 31/2851; H01L 23/3107; H01L 23/3135; H01L 23/04; H01L 22/34; H01L 22/14; G01D 11/245; G01P 1/026
See application file for complete search history.

(56) References Cited

U.S. PATENT DOCUMENTS

| 3,967,366 A * | 7/1976 | Birglechner ...... H01L 23/49524 29/827 |
| 4,637,130 A * | 1/1987 | Fujii .................... H01L 21/565 257/666 |

(Continued)

FOREIGN PATENT DOCUMENTS

| DE | 102005012709 A1 | 9/2006 |
| JP | 2001116815 A | 4/2001 |

OTHER PUBLICATIONS

International Search Report and Written Opinion for International Application No. PCT/FR2017/052379, dated Jan. 30, 2018—8 pages.

*Primary Examiner* — Alvaro E Fortich
*Assistant Examiner* — Zannatul Ferdous
(74) *Attorney, Agent, or Firm* — RatnerPrestia

(57) ABSTRACT

A method for producing, on a metal retainer plate, an electronic module undergoing an electrical test. Prior to a final overmolding that forms the exterior envelope of the electronic module, there is performed a limited initial overmolding of at least one electrical-connection zone, thus surrounding a free-end portion of a rough form of an insulating second securing bar, by establishing between these a non-conducting overmolded bridge, a first securing bar is cut off from a component or element in order to (Continued)

electrically isolate said at least one electrical-connection zone, and an electrical test is performed on the zone prior to the final overmolding of the exterior envelope, with the electronic component or element being secured to the insulating second securing bar and to the retainer plate by the overmolded bridge.

11 Claims, 4 Drawing Sheets

(51) Int. Cl.
*G01P 1/02* (2006.01)
*G01D 11/24* (2006.01)

(56) References Cited

U.S. PATENT DOCUMENTS

| | | | | |
|---|---|---|---|---|
| 5,498,902 | A * | 3/1996 | Hara | H01L 21/565 |
| | | | | 257/666 |
| 5,559,433 | A * | 9/1996 | Onizuka | G01B 7/31 |
| | | | | 174/535 |
| 6,003,369 | A * | 12/1999 | Tola | G01P 1/026 |
| | | | | 257/686 |
| 6,334,361 | B1 | 1/2002 | De Volder et al. | |
| 7,954,215 | B2 * | 6/2011 | Saito | G01P 15/0802 |
| | | | | 181/171 |
| 9,615,469 | B2 * | 4/2017 | Schillinger | G01D 11/245 |

* cited by examiner

METHOD FOR PRODUCING AT LEAST ONE ELECTRONIC MODULE ON A METAL RETAINER PLATE, INCLUDING AT LEAST ONE ELECTRICAL TEST

CROSS REFERENCE TO RELATED APPLICATIONS

This application is the U.S. National Phase Application of PCT International Application No. PCT/FR2017/052379, filed Sep. 7, 2017, which claims priority to French Patent Application No. 1658329, filed Sep. 8, 2016, the contents of such applications being incorporated by reference herein.

FIELD OF THE INVENTION

The present invention relates to a method for producing at least one electronic module on a metal retainer plate, this method including at least one electrical test of said at least one electronic module. This production method is carried out on a metal retainer plate to which at least one electronic module is secured.

BACKGROUND OF THE INVENTION

An electronic module comprises at least one electronic component, of the microprocessor, integrated circuit, electromagnetic compatibility circuit, type, tracks and at least one electrical-connection element, of the electrical connecting element type, for example one or more connecting pins.

In the conventional way, the electronic component or components or the electrical-connection element or elements comprise at least one electrical-connection zone that is to be electrically tested. A number of electrical tests may thus be carried out on such an electrical module, preferably before final overmolding of the electronic module, so that faulty components or elements can, if necessary, be repaired or replaced.

According to the prior art, it is not possible to electrically test parts of an electronic module without this module being detached from the retainer plate. Because a retainer plate often supports several electronic modules, all of the modules have to be detached from the retainer plate and tested individually.

This is because the retainer plate is made of metal, as are the securing bars which are in direct electrical contact with an electronic component or an electrical-connection element. It is therefore not possible to isolate, on the electronic module, an electrical-connection zone that is to be tested. It is for this reason that the electronic module has to be detached from the retainer plate and tested individually.

This introduces a test-duration cost and also a handling cost.

Conducting an electrical test on an unfinished electronic module which therefore does not have the overmolded envelope of the electronic module encasing all the electronic components and electrical-connection elements of the electronic module is not possible given that, when the electronic module is detached from the retainer plate and from the securing bar or bars, there is no possible way of securing the components and elements to one another and that, when not detached from the retainer plate, the electrical-connection zones in the electronic module are not isolated, thereby rendering electronic testing impossible.

It is therefore commonplace not to test the electronic modules until they have been overmolded so that the electronic components and the electrical-connection elements are kept fixed relative to one another. In that case, when an electronic component or an electrical-connection element is defective, it is the entire electronic module that has to be rejected, thus increasing the rejection cost of an electronic module.

SUMMARY OF THE INVENTION

The problem that the present invention addresses is that of testing one or more electrical-connection zones of at least one electronic module secured to a metal retainer plate during the production thereof without the electronic module being detached from the retainer plate.

To this end, an aspect of the present invention relates to a method for producing, on a metal retainer plate, at least one electronic module comprising at least one electronic component or at least one electrical-connection element for connection to at least the component or the element undergoing at least one electrical test, the retainer plate comprising at least a first securing bar for securing said at least one component or element to the plate and at least one rough form of an insulating second securing bar having a free end pointing toward said at least one component or element, leaving a space between the end and the component or element, said at least one component or element comprising at least one electrical-connection zone that is to be electrically tested, notable in that:

prior to a final overmolding that forms the exterior envelope of the electronic module, there is performed an initial overmolding limited to said at least one electrical-connection zone, thus surrounding a free-end portion of said at least one rough form of an insulating second securing bar, by establishing a non-electrically-conducting overmolded bridge in the space between the free-end portion and said at least one electrical-connection zone, the rough form and the associated overmolded bridge forming the insulating second securing bar, said at least one first securing bar is cut off from said at least one component or element in order to electrically isolate said at least one electrical-connection zone, and at least one electrical test is performed on said at least one electrical-connection zone, said at least one electronic component or connection element being secured to said at least one rough form of an insulating second securing bar and to the retainer plate by the overmolded bridge.

The designation "electronic component" covers any electronic component such as an integrated circuit, a capacitor, a resistor, an electromagnetic compatibility circuit, etc., but also covers any electrical interconnection between same, such as tracks.

The technical effect is that it allows at least one electrical test to be carried out on the or each electronic module supported by the metal retainer plate because of the presence of an electrically non-conducting overmolded bridge which therefore insulates one or more zones that are to be electrically tested from the retainer plate while at the same time securing a or each module to the retainer plate once the first metal securing bar or bars have been cut off from the or each module. It then follows that the or each module can be tested during the stages of its production, this being either before or after its final overmolding that forms a casing delimiting the electronic module. An electrical test can thus be performed with the electronic module still secured to the retainer plate.

The rough form or rough forms of the insulating second securing bars, which are made of metal like the first securing bar or bars, are not in direct contact with an electronic component or with an electrical connection element of the electronic module. It is the overmolded bridge that mechanically secures a rough form of an insulating second securing bar to the component or the element of the electronic module while at the same time electrically isolating the component or the element. It then follows that an aspect of the present invention confers upon an insulating second securing bar or bars a function of securing to the component or the element of the electronic module while at the same time maintaining the electrical isolation thereof, which is a function it or they did not have in the prior art. This is possible once the non-insulating first securing bar or bars have then been cut off.

The electrical test can be carried out either before overmolding of the external envelope or afterward, the electronic module still being secured to the retainer plate at least by the insulating second securing bar comprising a rough form and an overmolded bridge.

Advantageously, said at least one electrical test is carried out on said at least one electronic module still secured to the metal retainer plate, said at least one insulating second bar then being cut off at the overmolded bridge.

Prior to that, it is possible to have retained, without cutting them off, another or certain other first securing bars that have no influence on the isolation of one or more electrical-connection zones that are to be tested, these first securing bars therefore not disrupting the conducting of one or more electrical tests. In that case, such first securing bars can be cut off after final overmolding. Conversely, it is possible to have cut off all the first securing bars, the insulating second securing bar or bars alone then securing to the retainer plate the electronic module that is in the process of being produced.

Advantageously, the retainer plate comprises a frame secured to a respective end of said at least one first securing bar and of said at least one rough form of an insulating second securing bar, said at least one bar or rough form respectively having a free end at the opposite end to the end that is secured to the frame, said at least one component or element being secured to the free end of said at least one first securing bar.

One form of frame makes it possible, if need be, to house the most possible electronic modules within it and enables material savings on the retainer plate while at the same time providing effective securing to the electronic module or modules placed inside the frame. It is possible to mark on a corner of the frame information relating to the electronic module(s).

Advantageously, the retainer plate and said at least one first and second securing bar are produced as a single piece by creating a metal component by cutting, stamping or 3-D printing. The retainer plate is thus economical to produce while at the same time being mechanically strong.

Advantageously, the retainer plate is intended to support at least two electronic modules, said respective at least one electronic component and electrical-connection element of said at least two electronic modules being tested while secured to the retainer plate. This makes it possible to produce several electronic modules on the one same retainer plate while electrically testing them without detaching them from the retainer plate. It then follows that the electrical test or tests are conducted more easily than on electronic modules considered separately from one another.

Advantageously, said at least one electronic module comprises at least two zones that are to be electrically tested, the two zones being initially and partially overmolded, and being so independently of one another. The initial and partial overmolding therefore relates only to restricted zones that are to be electrically tested.

Advantageously, when said at least one electronic module that is to be produced has at least one connecting pin by way of an electrical-connection element having a zone that is to be electrically tested, said at least one connecting pin being connected to said at least one electronic component by one end, the rest of the connecting pin projecting from the envelope of the electronic module, the limited initial overmolding is also performed on an end portion of the connecting pin connected to said at least one electronic component.

The connecting pin or pins, part of which projects from the envelope of the electronic module, are thus held in place by a limited initial overmolding with respect to the electronic module that precedes the final overmolding of the envelope of the electronic module. That allows the connecting pin or pins to be held more effectively in addition to electrically isolating the connecting pin or pins. This initial overmolding can in part project from the exterior envelope that a casing of the electronic module will form, the casing being obtained by the final overmolding. The initial overmolding is not restricted to said at least one connecting pin and may cover other components of the electronic module.

Advantageously, the final overmolding and the limited initial overmolding are performed in an electrically insulating resin. For example, epoxy resin is a material often used for an overmolding that falls within the specific context of an aspect of the invention, as it is also a material that is electrically insulating.

An aspect of the invention also relates to an electronic module comprising at least one electronic component and at least one connecting pin extending in part outside a casing forming an envelope of the electronic module with an end portion connected to said at least one electronic component, notable in that the electronic module is produced in accordance with such a method, the electronic component and the end portion of said at least one connecting pin connected to said at least one electronic component bearing a limited initial overmolding which, in the case of the electronic component, ends at least flush with the exterior envelope that forms the casing of the electronic module.

"At least flush with" means that the end portion of the limited initial overmolding is at least at the same level as the exterior envelope or extends beyond the exterior envelope: it is therefore visible from the exterior envelope without projecting from this exterior envelope or projects by a limited amount with respect to this exterior envelope. "Flush with" means that the overmolded bridge has been cut off level with the casing but this cutting-off can also be done some distance from the casing while being at least flush.

It then follows that an electronic module produced according to a method according to an aspect of the invention is recognizable from an electronic module produced according to a method according to the prior art. The final overmolding and the limited initial overmolding are recognizable and the or each cut overmolded bridge. The same may also be true of a connecting pin having an initial overmolding portion that projects from the exterior envelope of the electronic module.

Specifically, another part of the limited initial overmolding, which is preferably not an overmolded bridge, may project from the casing of the electronic module. This is the case with a limited initial overmolding portion which surrounds the portion closest to the casing of one or more electrical-connection pins projecting from the casing. This overmolding portion may therefore be intercalated between the final overmolding and the connecting pins to supplement the final overmolding on the pin portions projecting from the casing. Initial overmolding portions projecting from the casing of the electronic module thus make it possible to differentiate an electronic module according to an aspect of the invention from a module according to the prior art.

According to an aspect of the present invention, the first securing bar or bars are cut off prior to final overmolding. There are therefore no portions of first securing bars definitively remaining in the electronic module and passing through the final overmolding as they do the prior art. This latter had the disadvantage of making it easier for corrosion to get in, given the presence of two different materials namely the metal and the electrically insulating resin, and given the possibility for oxidation of the portions of the first bars definitively remaining in the electronic module.

All this is of particular relevance when the electronic module forms part of a sensor working under high-temperature and harsh environmental conditions, such as in the case of a measurement sensor in a motor vehicle comprising such an electronic module. The ingress of and formation of a flow circuit for a liquid substance contained in the environment surrounding the electronic module could arise out of such a metal/electrically insulating resin interface.

In addition, the cutting-off of the first securing bar or bars at the level of the final overmolding would lead to cutting difficulties with the potential to damage the envelope of the electronic module. All of these disadvantages are avoided according to an aspect of the present invention.

An aspect of the invention also relates to a measurement sensor present in a motor vehicle, characterized in that it comprises such an electronic module.

BRIEF DESCRIPTION OF THE DRAWINGS

Other features, aspects and advantages of the present invention will become apparent upon reading the detailed description that will follow and upon examining the appended drawings, given by way of nonlimiting example and in which.

DETAILED DESCRIPTION OF THE PREFERRED EMBODIMENTS

In what follows, in the specific case of the embodiment of the electronic module according to an aspect of the present invention that is shown in the figures, the front of the electronic module is defined by its face adjacent to the integrated circuit and the rear of the electronic module is defined by its face via which the connecting pins protrude.

What is meant by a "rough form of an insulating second securing bar" is an incomplete second-bar portion that will be combined with an overmolded bridge to form the insulating second securing bar proper.

Figure 5:
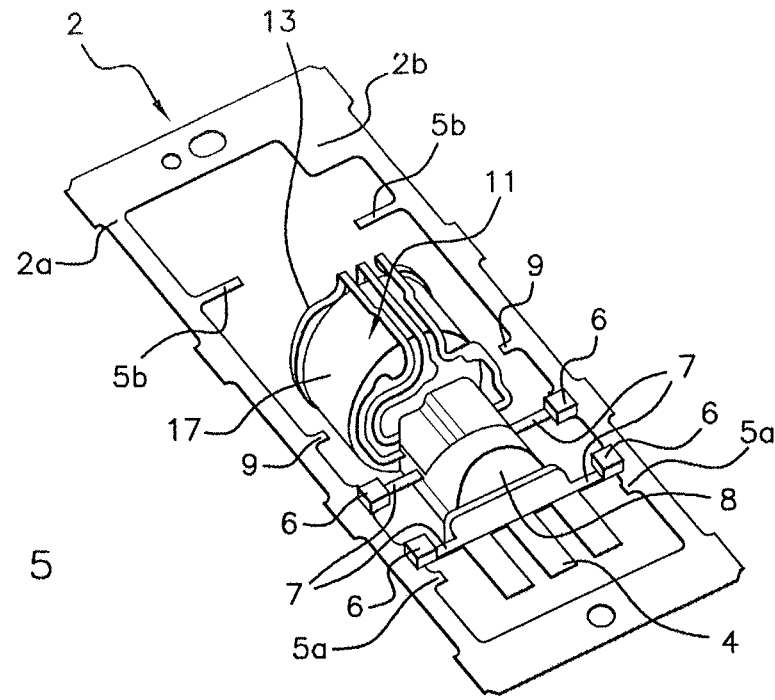
Figure 6:
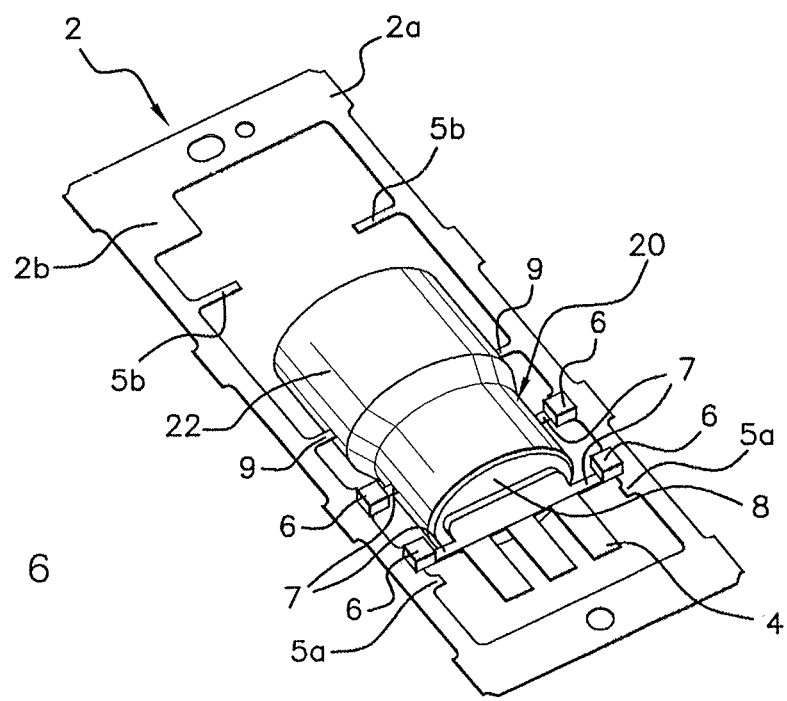
Figure 7:
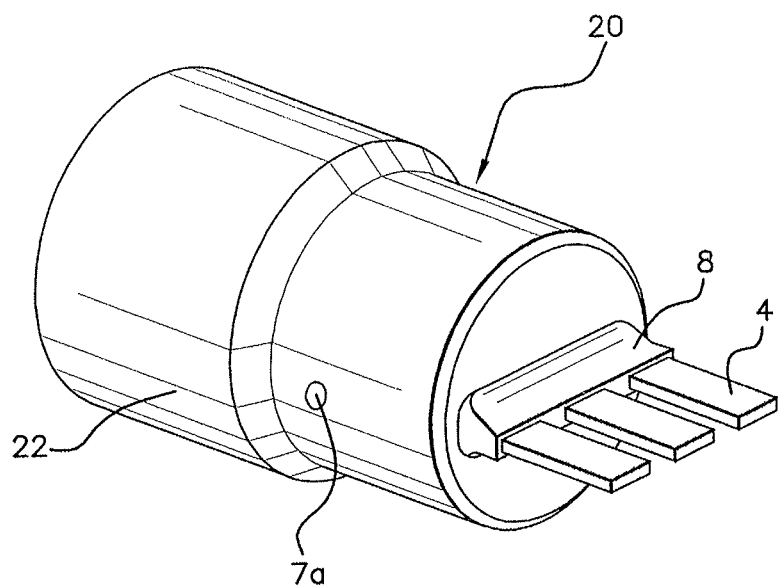
FIG. 7 is a schematic depiction of a perspective view of one embodiment of an electronic module obtained according to a production method according to an aspect of the present invention.

The electronic module is shown in FIG. 7 as an enlargement by comparison with the module of FIGS. 1 to 6 which is in the process of being produced. When reference is made to one or more specific figures, these figures are to be considered in combination with the other figures in order to ascertain the designated numerical references that are missing from this or these specific figure(s). For example, the reference 20 for an electronic module or the reference 22 for a casing is visible only in FIGS. 6 to 8, the electronic module being incomplete in the other figures, but these references will be used to denote the electronic module or the casing in general for all the figures. In the figures, a single one of the three tracks is reference 11 and a single one of the three pins by way of electrical-connection element is referenced 4, but everything stated in respect of this referenced track or pin is valid for all the tracks or pins.

Figure 4:
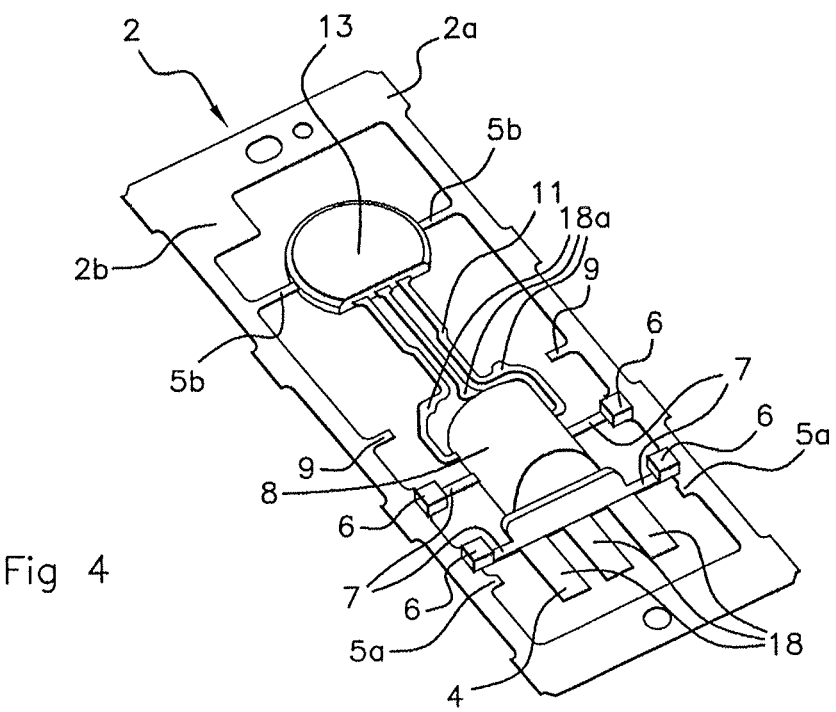

With reference to all the figures and notably to FIGS. 1 to 7, an electronic module being referenced 20 only in FIG. 7, an aspect of the present invention relates to a method for producing, on a metal retainer plate 2, at least one electronic module 20 comprising at least one electronic component 11, 15 and at least one electrical-connection element 4, for example at least one pin 4 pointing toward the outside of an envelope of the electronic module 20 incorporating the majority of the electronic module 20 thereby forming a casing 22, referenced in FIGS. 6 and 7.

In FIGS. 1 to 6, the electronic module 20 is shown with several electronic components, but this type of electronic module 20 with such components is nonlimiting to the scope of an aspect of the invention and merely illustrative of one electronic module 20 among so many others for which a production method according to an aspect of the present invention can be implemented.

The electronic module or modules 20 may be arranged so they extend along the length of the retainer plate 2. By way of electronic components, nonlimiting mention may be made of a microprocessor, an integrated circuit 15, an electromagnetic compatibility circuit. A magnet 17 may also be present in the electronic module 20.

Figure 1:
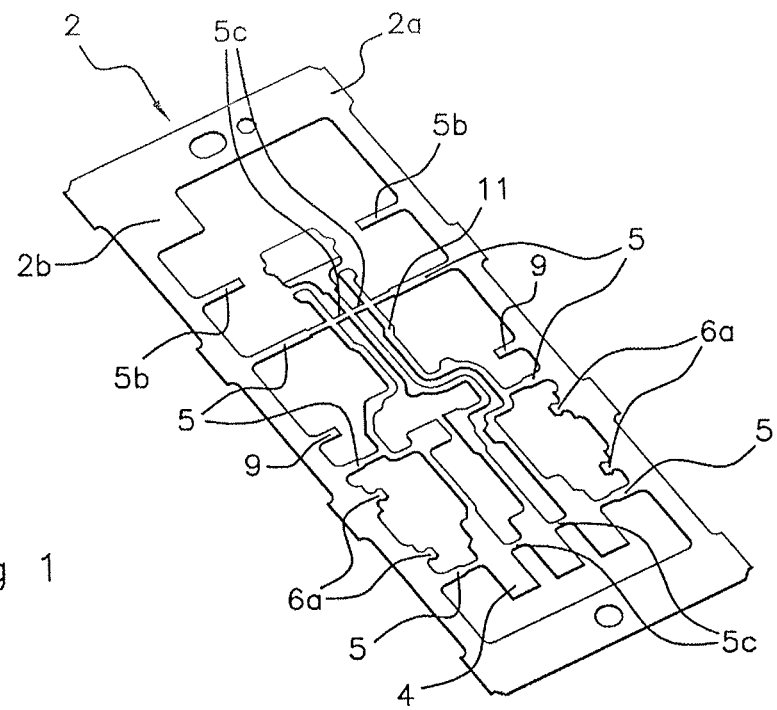
FIGS. 1 to 6 show the successive steps of one embodiment of a production method including at least one electrical test, on a metal retainer plate, of at least one electronic module comprising at least one electronic component and at least one electrical-connection element, this embodiment being in accordance with an aspect of the present invention.
Figure 2:
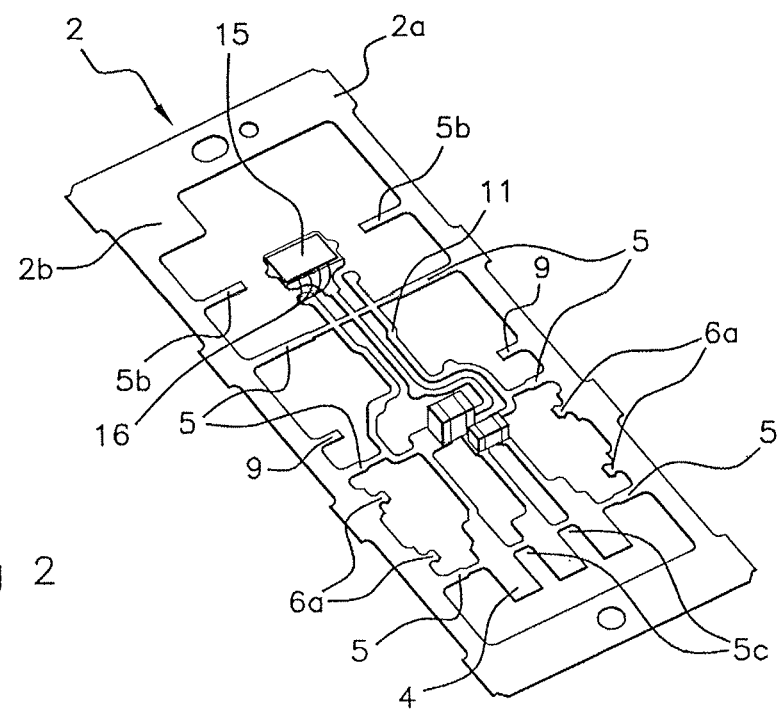
Figure 3:
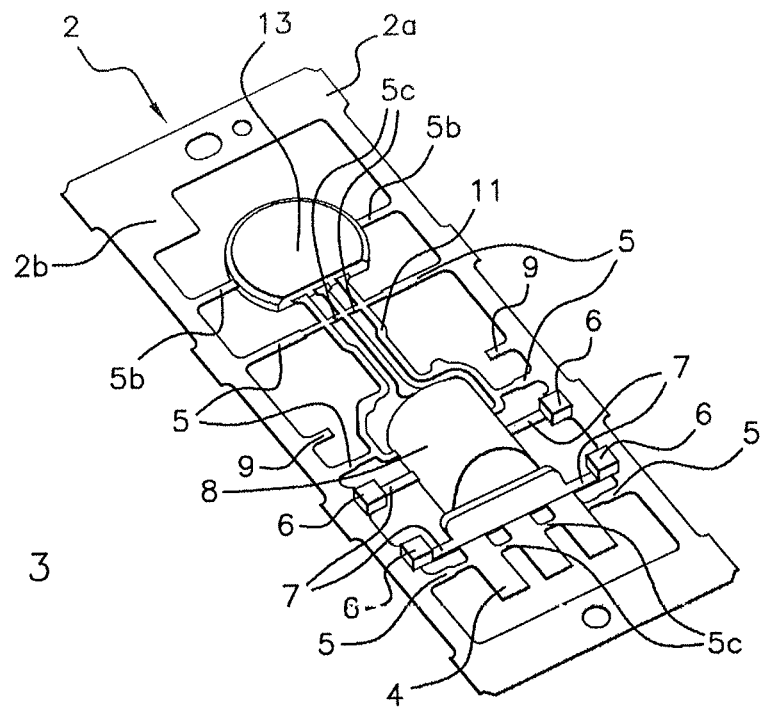

With reference to FIGS. 1 to 6, without this being limiting, the electronic module 20 may comprise an integrated circuit 15, not shown however in FIG. 1. In FIG. 2, this integrated circuit 15 is shown without a protective coating 13, advantageously although not exclusively, made of an epoxy material, which protective coating 13 is shown in FIGS. 3 to 5.

In FIG. 2, the integrated circuit 15 is connected to tracks 11 by one or more connecting wires 16. The connecting tracks 11 connect the integrated circuit 15 to other electronic components, for example one or more capacitors, an electromagnetic compatibility unit or other components referred to as surface-mount components. In FIG. 5, a magnet 17 is inserted in the electronic module 20 with portions of tracks 11 and of the integrated circuit 15 being bent back against the magnet 17.

In the context of a method according to an aspect of the present invention, said at least one electronic component 11, 15 or said at least one electrical-connection element 4 may be subjected to at least one electrical test. This may for example be performed, on the one hand, advantageously on the tracks 11 once they have been bent back onto the magnet 17 and, on the other hand, consecutively on the pins 4. Respective test points 18 and 18a on the tracks 11 and on the pins 4 are shown in FIG. 4, there being three points 18 for connection elements 4 and three points 18a for the tracks 11.

The method for producing the electronic module or modules 20 is performed on a metal retainer plate 2, the electrical module or modules 20 being secured to the retainer plate 2. The electrical test or tests are performed on the electronic module or modules 20 still secured to the retainer plate 2.

The retainer plate 2 comprises at least a first securing bar 5 securing said at least one component 11, 15 or electrical-connection element 4 of the or each electronic module 20 to the plate 2. The retainer plate 2 also comprises at least one rough form 6a of an insulating second securing bar 6 not contacting said at least one component 11, 15 or electrical-connection element 4. What is meant by a "rough form 6a of an insulating second securing bar" is an incomplete insulating second securing bar such as an anchor stud or any arbitrary portion of a second securing bar that is shorter than the complete insulating second securing bar 6. This rough form 6a of second securing bar will be supplemented by an electrically insulating overmolded stud 7 as will be seen later.

"First bar" is to be considered as meaning a bar of a first type and "insulating second securing bar 6" means a bar of the second type. Several first securing bars 5 and several insulating second securing bars 6 may coexist together.

The first securing bar or bars 5 serve to support one or more electronic components and/or one or more electrical-connection elements of each electronic module 20 in the process of being mounted without the envelope of the electronic module 20 having already been overmolded, the bar(s) alone providing the support for the components or elements.

The first securing bars 5 are secured firmly to the components or electrical-connection elements of the electronic module 20, for example being made as one piece with this or these components or bonded or welded to this or these components. The first securing bars 5 are often made of metal and such a connection between components or electrical-connection elements and first securing bars 5 is electrically conducting.

The rough form or rough forms 6a of insulating second connecting bars 6 have a free end pointing toward said at least one component 11, 15 or element 4, leaving a space between them. This free end of the rough form or rough forms 6a is T-shaped given that it is intended to be surrounded by an overmolded bridge 7 and that a T-shape is propitious for anchoring the free end inside the overmolded bridge 7.

Nonlimitingly, the rough form or rough forms 6a of the insulating second securing bars 6, as in the prior art, could serve to limit the overmolding of the envelope of the electronic module 20 and to help with the positioning of the overmolding of the envelope of the electronic module 20, this overmolding being referred to in an aspect of the present invention as final overmolding. This role may optionally be performed in an aspect of the present invention by a fourth type of bar, referred to as envelope bars 9 and which will be detailed more fully later.

As will be seen later, an aspect of the present invention proposes to confer upon this or these rough form(s) 6a of insulating second bars 6 a role of retaining and isolating certain zones borne by the electronic component or components 11, 15 and/or the electrical-connection element or elements 4 of the or each electronic module 20 in the process of being mounted during the production of the electronic module 20 and, more particularly, for the conducting of one or more electrical test(s). This is achieved by an initial overmolding that forms a bridge overmolded on the rough form 6a or each rough form 6a of an insulating second securing bar.

It is the electronic component or components 11, 15 or the electrical-connection element or elements 4 that are to be electrically tested by having at least one electrical-connection zone that is to be electrically tested. All the electronic components 11, 15 or the electrical-connection elements 4 can be electrically tested, or just some of them.

In FIGS. 1 to 6, the retainer plate 2 is planar and rectangular, surrounding an electronic module 20, although this is nonlimiting. There may be more than one electronic module 20 per plate 2, for example, nonlimitingly, there may be 16, 24 or 32 electronic modules 20 per retainer plate 2, and not necessarily an even number.

FIGS. 1 to 6 show six first securing bars 5, two for the tracks 11 near the integrated circuit 15, two for the tracks 11 mid-way along the length of the retainer plate 2, and two for the connecting pins 4 that the electronic module 20 comprises at a longitudinal end referred to as the rear end.

Two intermediate securing bars 5c are also provided between the connecting pins 4 of which there are three, and two intermediate securing bars 5c are provided between the tracks 11 of which there are three near the integrated circuit 15, the intermediate securing bars 5c being aligned with the associated first securing bars 5.

Also shown are four rough forms 6a or four insulating second securing bars 6, depending on the degree of advancement of the method, with four rough forms 6a of insulating second securing bars in FIGS. 1 to 2 having in FIGS. 3 to 6 become insulating second securing bars by having been supplemented respectively by an overmolded bridge 7. In addition, there may also be bars of a third type and of a fourth type.

The bars of a third type are temporary-retention bars 5b which temporarily come into contact with an internal element of the electronic module 20 when it is being assembled and temporarily hold this internal element during assembly. In the embodiment shown in FIGS. 1 to 6 and notably in FIGS. 3 and 4, these temporary-retention bars 5b hold in place the protective coating 13 that envelops the integrated circuit 15. FIGS. 1 to 6 show two temporary-retention bars 5b per electronic module 20 on a retainer plate.

It is not necessary to secure these temporary-retention bars 5b to the protective coating 13 because their action is merely temporary. The fact that the protective coating 13 is intercalated between two retaining bars 5b leading from one respective longitudinal side of the retainer plate 2 may be enough to hold it in place by simple contact with the ends of the temporary-retention bars 5b. Conversely, it is also possible to secure the protective coating 13 temporarily to each end of the temporary-retention bars 5b by bonding or welding.

In FIG. 1, an integrated circuit has not yet been positioned at the front of the electronic module. In FIG. 2, the integrated circuit 15 is positioned at the front of the electronic module 20 but the protective coating 13 has not yet been installed and the temporary-retention bars 5b each have a free end leaving between each of them and the portion of the integrated circuit 15 opposite enough space for the introduction of the protective coating 13 between the portion of integrated circuit 15 and their free ends.

In FIGS. 3 and 4, the protective coating 13, while encasing the integrated circuits 15, is inserted between the free ends of the two temporary-retention bars 5b.

In FIG. 5, the tracks 11 initially extending in the plane of the retainer plate 2, these tracks 11 connecting the integrated circuit 15 encased in the protective coating 13, are bent through around 90° to form two bent-over portions spaced away from one another, these portions being bent in opposite directions from one another. A planar portion of the tracks 11 connects these two bent-over portions, running parallel to the plane of the retainer plate 2. The bent-over portions and the planar portion of the tracks 11 surround a substantially cylindrical magnet 17. One of the bent-over portions bears the integrated circuit 15 which is pressed against the magnet 17.

As shown in FIG. 5, in this bent-over position, the free ends of the temporary-retention bars 5*b* are clear of contact with the protective coating 13 and rendered once again free. Likewise, the first securing bars 5 lying at the level of the tracks 11 in the vicinity of the integrated circuit 15 have been cut off to allow the tracks 11 to be bent over.

In FIG. 5, the electronic module 20 is secured to the retainer plate 2 only by the insulating second securing bars 6 through the creation of overmolded bridges 7 connecting the free ends of the rough forms 6*a* of insulating second bars 6 to the electronic module 20, the overmolded bridges 7 forming part of a limited initial overmolding 8.

The fourth type of bars groups together envelope bars 9 intended to come into contact with the final overmolding of the electronic module 20 forming a casing 22 for the electronic module 20, this being shown in FIG. 6. In FIGS. 1 to 6, two envelope bars 9 are provided. The envelope bars 9 may be similar to the rough forms 6*a* of insulating second securing bars 6, having substantially the same length.

In the figures, an or each electronic module 20 may have three pins 4 which form electrical-connection elements. A first securing bar 5 connects the first and third pins 4 respectively to a length of the retainer plate 2 whereas two intermediate first securing bars 5*c* connect each of the first or third pins 4 respectively to the second pin. The same is true of the securing of the tracks 11 to one another at the rear of the electronic module 20.

The majority of the first securing bars 5 and insulating second securing bars 6 may be positioned laterally with respect to the associated electronic module 20, but these bars may also be positioned to the front or to the rear of the associated electronic module 20.

According to an aspect of the present invention, prior to the final overmolding that forms the exterior envelope, there is performed a limited initial overmolding 8 at said at least one electrical-connection zone, thus surrounding a free-end portion of said at least one rough form 6*a* of an insulating second securing bar 6, by establishing a non-electrically-conducting overmolded bridge 7 in the space between the free-end portion of the rough form 6*a* and said at least one electrical-connection zone. This is shown in FIG. 5.

Said at least one first securing bar 5 is then cut off from said at least one electronic component 11, 15 or electrical-connection element 4 in order to electrically isolate said at least one electrical-connection zone. The overmolded bridge 7 remains the only thing securing said at least one electrical-connection zone to the retainer plate 2 via said at least one insulating second securing bar 6 thus formed. This overmolded bridge 7, advantageously made from resin in a material that is electrically insulating, notably of epoxy, is effectively not a conductor of electricity, thus rendering the second securing bar 6 insulating.

The electronic component or components 11, 15 and/or the electrical-connection element or elements 4 are then supported only by the limited initial overmolding 8, possibly with an overmolded bridge 7, the limited initial overmolding 8 connecting these components 11, 15 and/or elements 4 to an insulating second securing bar 6 or to the insulating second securing bars 6. This is the case in FIG. 5, in which all the first securing bars 5 have been cut off and are no longer visible or are visible only in terms of their portion that remains anchored to the retainer plate 2.

If one or more of the first securing bars 5 are not secured to one or more electrical-connection zones, then it is possible for this or these first securing bar(s) 5 not to be cut off, as they do not prevent the electrical test or tests from being conducted. This or these first securing bar(s) 5 will, however, be cut off before or after the final overmolding of the exterior envelope of the electronic module 20 to form the casing 22 encapsulating the electronic module 20.

After the limited initial overmolding 8, one or more electronic component(s) secured to one or more electronic component(s) already present may also be added.

The insulating second securing bars 6, formed of the rough forms 6*a* and of a respective overmolded bridge 7, which are shown in FIG. 5, perform a role of securing the tracks 11 to the retainer plate 2 after the cutting-off of the first securing bars 5 by holding these tracks 11. These tracks 11 may therefore be electrically isolated even though they have not experienced a limited initial overmolding 8 but have profited from the limited initial overmolding 8 performed at other points on the electronic module 20.

In the context of an aspect of the present invention, one or more electrical tests on the electrical-connection zone or zones is or are performed. Where possible, it is preferable for this or these electrical tests to take place with a planar retainer plate 2. This is because this or these electrical tests are easier to perform on a retainer plate 2 that is planar, but may also be performed after potential bendings, in the case of some of the electrical tests, notably tests on one or more auxiliary component(s).

This may therefore be done prior to the final overmolding of the exterior envelope or after this final overmolding, still with the electronic component or components 11, 15 or the electrical-connection element or elements 4 remaining secured to the insulating second securing bar or bars 6 by the overmolded bridges 7 that these bars 6 comprise.

In order to finalize the or each electronic module 20, the exterior envelope may be overmolded and then the overmolded bridge 7 cut off level with the exterior envelope or protruding from the exterior envelope after the electrical test or tests, the exterior envelope forming the casing 22 of the electronic module 20.

The overmolded bridge or bridges 7 that form part of a limited initial overmolding 8 encapsulating an electronic component 11, 15 of the electronic module 20, may be cut off as close as possible to the envelope of the electronic unit formed by the casing 22 in order to exhibit no roughness protruding beyond the envelope, namely flush with the envelope. The overmolded bridge or bridges 7 may, however, be cut off so that they protrude significantly from the envelope.

Conversely, when the limited initial overmolding 8 at least partially over part of its length encapsulates an electrical-connection element 4 such as one or more electronic connecting pins 4 projecting from the casing 22, the limited initial overmolding 8 may be left projecting from the casing 22 to form an interface between the pins 4 and the casing 22 by encapsulating the pin or pins 4 outside the casing 22 over a portion of their length. This is particularly clearly visible in FIG. 7.

The presence of a limited initial overmolding 8 is recognizable by the cross section of the overmolded bridge 7 encapsulated by final overmolding substantially at the same level as or extending beyond the final overmolding, which means to say at least coming flush to the exterior envelope of the electronic module 20 having passed through it. The presence of a limited initial overmolding 8 is therefore visible on the electronic module 20 produced according to a method according to an aspect of the present invention. Likewise, a portion of the limited initial overmolding 8 projecting from the casing 22 may also be discernible. This can be seen on the connecting pins 4 on the outside of the casing 22 of the electronic module forming the exterior envelope of the electronic module 20.

The final overmolding and the limited initial overmolding 8 may be made from the same material, for example epoxy resin, or in any event from an electrically insulating resin.

The steps of the production method are shown in FIGS. 1 to 6. Some of these steps are optional and inherent to the type of electronic module 20 that is to be produced. The same is true of the number of first securing bars 5 and of insulating second securing bars 6. Envelope bars 9 and temporary-retention bars 5b of the third and fourth types mentioned previously, as well as intermediate securing bars 5c may also be present in appropriate numbers.

FIG. 1 shows a first step of the method according to an aspect of the invention whereby the tracks 11 of the electronic module 20 are secured to a frame 2a of the retainer plate only by first securing bars 5. The integrated circuit has not yet been introduced into the retainer plate 2.

FIG. 2 shows a step specific to the electronic module 20 illustrated in FIGS. 1 to 6 with electrical connection of the integrated circuit 15 and of the tracks 11 by connecting wires 16. FIG. 3 shows a step of encapsulating the integrated circuit 15 in a protective coating 13, third temporary securing bars 5b flanking the protective coating 13. Not all of the features of these two steps are essential to the implementation of the production method according to an aspect of the present invention; only the presence of the tracks 11 and of an integrated circuit 15 are generally common to most electronic modules 20.

In FIGS. 1, 2 and 3, the free ends of the rough forms 6a of insulating second securing bars not yet formed have not been encapsulated in a respective overmolded bridge 7 and these free ends lie at some distance from the components of the electronic module 20.

FIG. 4 shows a step of limited initial overmolding 8 of portions of components 11 and of electrical-connection elements 4 of the electronic module 20 with the creation of overmolded bridges 7 connecting these portions respectively to a rough form to form an insulating second securing bar 6. The overmolded bridges 7 are made of an insulating material, ensuring insulation between the portions of the electronic module 20 that were initially overmolded and the rough forms of the insulating second securing bars 6, which rough forms are no longer or barely visible in this figure as they have, for the most part, been overmolded in a respective overmolded bridge 7.

FIG. 4 also shows a step of cutting off the first securing bars 5, stubs 5a of cut first bars being visible in this figure. The same is true of the intermediate securing bars 5c, for example between the electrical connecting pins 4 or between the tracks 11.

FIG. 5 shows a bending of the tracks 11 ending in the integrated circuit 15 around a magnet 17. The third temporary securing bars 5b therefore no longer play the role of securing to the protective coating 13 of the integrated circuit 15 of the electronic module 20. This step is not essential to the implementation of the method according to an aspect of the present invention.

FIG. 6 shows the final overmolding of the electronic module 20, thereby forming its casing 22. The overmolded bridges 7 may project from the casing 22 or lie flush with the casing 22 but will be cut off either level with the envelope of the casing 22 or such that they project from the casing 22. The limited initial overmolding 8 may also project from the casing 22 partially flanking electrical-connection elements 4 external to the casing 22, in this instance the connecting pins 4. Fourth envelope bars 9 may locally limit the final overmolding that forms the casing 22 by coming into contact with it locally, something which is not essential in the context of an aspect of the invention.

In one preferred embodiment of the retainer, plate 2, this retainer plate 2 may comprise a frame 2a secured amongst other things to a respective end of the first securing bar or bars 5 and to the rough form or rough forms 6a of insulating second securing bars 6.

Said at least one first securing bar 5 and rough form 6a of an insulating second securing bar 6 respectively have a free end at the opposite end to the end secured to the frame 2a, the free end of the first securing bar or bars 5 being secured to an electronic component 11, 15 or to an electrical-connection element 4 of the electronic module 20.

The frame 2a may have a writing zone 2b on which information relating to the electronic module 20 may be written, for example, although not solely, information pertaining to the electrical tests.

The retainer plate 2 therefore via its frame 2a delimits an internal opening used for positioning and securing electronic components 11, 15 or other components that form part of one or more electronic module(s) 20 in the process of being produced.

In the case of the or each of the first securing bars 5, the electronic component or components 11, 15 or the electrical-connection element or elements 4 may be secured to the free end of this first securing bar 5. This securing may be achieved by welding or bonding. In the case of the or each of the rough forms 6a of the insulating second securing bars 6, the electronic component or components 11, 15 or the electrical-connection element or elements 4 may be positioned some distance away from this rough form 6a of an insulating second securing bar 6 before the limited initial overmolding 8, this limited initial overmolding 8 creating an overmolded bridge 7.

The retainer plate 2 and said at least one first 5 and second 6 securing bars may be produced as a single piece by cutting or stamping from a piece of electrically conducting metal. The cutting may be cutting of any kind, for example waterjet cutting or laser cutting. It is also possible to obtain the retainer plate by 3-D printing, notably with the depositing of material and agglomeration using any means.

As an alternative, said at least one first securing bar 5 and at least one rough form 6a of insulating second securing bar 6 may be bonded or welded to the retainer plate 2.

As previously mentioned, the retainer plate 2 may be intended to support at least two electronic modules 20, for example 16, 24 or 32 modules. At least one of the electronic components 11, 15 or at least one of the electrical-connection elements 4 of each module 20 may be tested before or after a final overmolding of the envelope of the electronic module 20 that incorporates them, it being possible for this to be done while keeping all the modules 20 of the plate 2 secured to the retainer plate 2.

Each electronic module 20 may comprise at least two zones that are to be electrically tested. In the figures, although this is nonlimiting, these may be the tracks 11 connecting the integrated circuit 15 to the rest of the electronic module 20 and one or more, connecting pin(s) 4. An initial overmolding 8 limited to each zone that is to be tested or to a zone adjacent to the zone that is to be tested is therefore performed beforehand. The two zones may be overmolded initially and partially, and be so independently of one another.

An aspect of the invention also relates to an electronic module 20 comprising at least one electronic component 11, 15 and at least one connecting pin 4 extending partially outside of the envelope of the electronic module 20 with an end portion connected inside the electronic module 20, for example to at least one electronic component 11, 15.

With more particular reference to FIG. 7, such an electronic module 20 is produced and tested in accordance with a method as described hereinabove. The end portion of the connecting pin 4 connected to said at least one electronic component 11, 15 may bear a limited initial overmolding 8 a portion of which projects from the casing 22 while encapsulating a portion of the pin or pins 4, the pins 4 projecting from the casing 22 while being encapsulated on their adjacent portions by the portion of the overmolding which itself projects from the casing 22. A cut off overmolded bridge 7 is visible as a cut-off portion 7a on the envelope of the casing. This cut-off portion 7a lies flush at least with the envelope of the casing 22, therefore lying at the same level as this envelope that forms the casing 22 or projecting externally from this envelope.

Figure 8:
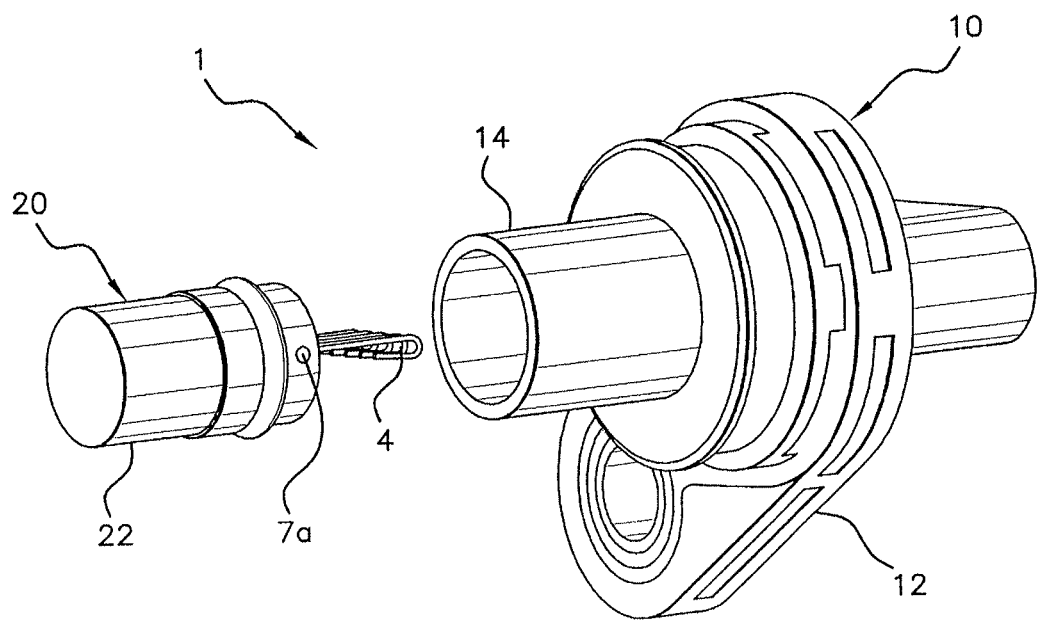
FIG. 8 is an exploded perspective view of a measurement sensor incorporating the electronic module according to an aspect of the invention.

With more particular reference to FIG. 8, an aspect of the present invention also relates to a measurement sensor 1 comprising such an electronic module 20. This measurement sensor 1 can be used in a motor vehicle as a sensor 1 that senses the speed or position of a drive shaft such as a camshaft or a crankshaft, notably being an inductive sensor 1, although this is nonlimiting.

By way of example, this sensor 1 may more specifically be a sensor 1 that measures the speed or position of a drive shaft of the motor vehicle such as, for example, a camshaft or a crankshaft. The measurements taken by the sensor 1 are sent in the form of electrical signals to an electronic command/control unit of the vehicle which uses them to manage the engine parameters. This electronic command/control unit is known to those skilled in the art as an ECU which stands for "Electronic Control Unit".

The sensor 1 is connected to the electronic control unit by three electric lines comprising a power supply, an output for sending electrical signals from the sensor 1 to the electronic control unit, and an electrical ground.

In FIG. 8, the pins 4 projecting from the casing 22 of the electronic module 20 have a curved shape differing from the planar shape shown in FIGS. 1 to 7, which is nonlimiting, these two modes being able to be employed as alternative.

In general, the sensor 1 comprises a base 10 and the electronic module 20. The base 10 has a lug-shaped envelope 12 allowing the sensor 1 to be attached to a part of the vehicle such as, for example, the structure of the chassis or a wall, and a barrel 14, made as one with the envelope 12, designed to house the electronic module 20 within it. The electronic module 20 is configured to measure values of parameters that can be used by the electronic control unit to manage the operation of the vehicle engine.

For example, the electronic module 20 may be configured to measure the electromagnetic field in the vicinity of a target mounted on a drive shaft of the vehicle in order to determine the speed or position thereof. The electronic module 20 comprises a casing 22 of cylindrical shape, closed at one of its ends and inside which the electronic components previously mentioned with reference to FIGS. 1 to 6 are inserted.

In FIG. 8, the electronic module 20 is discernible as having been produced using a method according to an aspect of the present invention insofar as it has one end of a portion of an overmolded bridge 7a cut off at least flush with the casing 22 and visible on the envelope thereof.

The invention claimed is:

1. A method for producing, on a metal retainer plate, at least one electronic module comprising at least one electronic component and at least one electrical-connection element for connection to at least the component or the element undergoing at least one electrical test, the retainer plate comprising at least a first securing bar for securing said at least one component or element to the plate and at least one rough form of an insulating second securing bar having a free end pointing toward said at least one component or element, leaving a space between an end and the component or element, said at least one component or element comprising at least one electrical-connection zone that is to be electrically tested, wherein:

prior to a final overmolding that forms an exterior envelope of the electronic module, there is performed an initial overmolding limited to said at least one electrical-connection zone, thus surrounding a free-end portion of said at least one rough form of an insulating second securing bar, by establishing a non-electrically-conducting overmolded bridge in the space between the free-end portion and said at least one electrical-connection zone, the rough form and the associated overmolded bridge forming the insulating second securing bar, cutting off said at least one first securing bar from said at least one component or element in order to electrically isolate said at least one electrical-connection zone, and performing at least one electrical test is on said at least one electrical-connection zone, said at least one electronic component or element being secured to said at least one insulating second securing bar and to the retainer plate by the overmolded bridge.

2. The method as claimed in claim 1, wherein said at least one electrical test is carried out on said at least one electronic module still secured to the metal retainer plate, said at least one insulating second bar then being cut off at the overmolded bridge.

3. The method as claimed in that claim 1, wherein the retainer plate comprises a frame secured to a respective end of said at least one first securing bar and of said at least one rough form of an insulating second securing bar, said at least one bar and rough form respectively having a free end at an opposite end to the end that is secured to the frame, said at least one component or element being secured to the free end of said at least one first securing bar.

4. The method as claimed in claim 3, wherein the retainer plate and said at least one first securing bar and at least one rough form of insulating second securing bar are produced as a single piece by creating an electrically-conducting metal component by cutting, stamping or 3-D printing.

5. The method as claimed in claim 1, wherein the retainer plate is intended to support at least two electronic modules, said respective at least one electronic component and electrical-connection element of said at least two electronic modules being tested while secured to the retainer plate.

6. The method as claimed in claim 1, wherein said at least one electronic module comprises at least two zones that are to be electrically tested, the two zones being initially and partially overmolded, and being so independently of one another.

7. The method as claimed in claim 1, wherein said at least one electronic module that is to be produced has at least one connecting pin by way of an electrical-connection element having a zone that is to be electrically tested, said at least one connecting pin being connected to said at least one electronic component by one end, the rest of the connecting pin projecting from the envelope of the electronic module, a limited initial overmolding also being performed on an end portion of the connecting pin connected to said at least one electronic component.

8. The method as claimed in claim 1, wherein the final overmolding and the limited initial overmolding are performed in an electrically insulating resin.

9. An electronic module comprising at least one electronic component and at least one connecting pin extending in part outside a casing forming an envelope of the electronic module with an end portion connected to said at least one electronic component, the electronic module is produced in accordance with a method as claimed in claim 1, the electronic component and the end portion of said at least one connecting pin connected to said at least one electronic component bearing a limited initial overmolding which, in a case of the electronic component, ends at least flush with the exterior envelope that forms the casing of the electronic module, said electronic module having an end of a portion of an overmolded bridge cut off at least flush with the casing and visible on the envelope thereof.

10. A measurement sensor present in a motor vehicle, comprising an electronic module as claimed in claim 9.

11. The method as claimed in claim 2, wherein the retainer plate comprises a frame secured to a respective end of said at least one first securing bar and of said at least one rough form of an insulating second securing bar, said at least one bar and rough form respectively having a free end at an opposite end to the end that is secured to the frame, said at least one component or element being secured to the free end of said at least one first securing bar.

* * * * *

UNITED STATES PATENT AND TRADEMARK OFFICE
CERTIFICATE OF CORRECTION

PATENT NO. : 10,746,786 B2  
APPLICATION NO. : 16/323859  
DATED : August 18, 2020  
INVENTOR(S) : Hervé Contet, Martin Throm and Dietmar Huber Page 1 of 1

It is certified that error appears in the above-identified patent and that said Letters Patent is hereby corrected as shown below:

In the Claims

In Column 14, Line 38, Claim 1 between the words 'test' and 'on', delete the word "is".

In Column 15, Line 21, Claim 9 after the word 'component', insert the word -- wherein --.

Signed and Sealed this  
Twenty-fourth Day of November, 2020

Andrei Iancu  
*Director of the United States Patent and Trademark Office*